United States Patent
Chen et al.

(10) Patent No.: US 11,511,467 B2
(45) Date of Patent: Nov. 29, 2022

(54) LIGHT EMITTING DEVICE AND MANUFACTURING METHOD THEREOF

(71) Applicant: Lumileds LLC, San Jose, CA (US)

(72) Inventors: Nan Chen, Shanghai (CN); Paul Scott Martin, Palo Alto, CA (US); Chao Ding, Shanghai (CN); Luke Cheng, Shanghai (CN)

(73) Assignee: Lumileds LLC, San Jose, CA (US)

( * ) Notice: Subject to any disclaimer, the term of this patent is extended or adjusted under 35 U.S.C. 154(b) by 52 days.

(21) Appl. No.: 16/648,431

(22) PCT Filed: Sep. 10, 2018

(86) PCT No.: PCT/EP2018/074303
§ 371 (c)(1),
(2) Date: Mar. 18, 2020

(87) PCT Pub. No.: WO2019/057534
PCT Pub. Date: Mar. 28, 2019

(65) Prior Publication Data
US 2020/0238582 A1   Jul. 30, 2020

(30) Foreign Application Priority Data

Sep. 19, 2017 (WO) ................ PCT/CN2017/102216
Oct. 11, 2017 (EP) ..................................... 17195850

(51) Int. Cl.
*H01L 33/00* (2010.01)
*B29C 45/16* (2006.01)
(Continued)

(52) U.S. Cl.
CPC ........ *B29C 45/1671* (2013.01); *H01L 33/005* (2013.01); *H01L 33/0095* (2013.01);
(Continued)

(58) Field of Classification Search
CPC .................. H01L 2933/005; H01L 33/005
(Continued)

(56) References Cited

U.S. PATENT DOCUMENTS 5,563,103 A * 10/1996 Komatsu ........... H01L 23/49562
257/E23.044
7,267,791 B2    9/2007 Ricking et al.
(Continued)

FOREIGN PATENT DOCUMENTS

CN          102593320 A    7/2012
DE           10163117 C1    1/2003
(Continued)

OTHER PUBLICATIONS

EP 17195850.7, "Extended European Search Report," dated Dec. 19, 2017, 13 pages.
(Continued)

*Primary Examiner* — Hsin Yi Hsieh

(57) ABSTRACT

The present invention relates to the field of automotive lamps, particularly a method for manufacturing a light emitting device (10) for use in automotive lamps. The method comprises: providing a base substrate (11) with a LED die (12) and one or more electrical components (13) attached thereon into a first mold; melting and injecting an optical transparent material over the LED die (12) to form an optical structure (14); removing the base substrate (11) from the first mold once the optical transparent material is partially solidified; providing the base substrate (11) into a second mold different from the first mold; and melting and injecting a thermally conductive material into the second mold while the optical transparent material is not fully solidified, such that an intimate connection is formed between the thermally conductive material and the optical
(Continued)

transparent material. The present invention further discloses the light emitting device (10) per se.

16 Claims, 2 Drawing Sheets

(51) Int. Cl.
*H01L 33/52* (2010.01)
*H01L 33/64* (2010.01)
*B29L 31/34* (2006.01)
*B29L 31/00* (2006.01)

(52) U.S. Cl.
CPC ............. *H01L 33/52* (2013.01); *H01L 33/64* (2013.01); *B29K 2995/0013* (2013.01); *B29K 2995/0026* (2013.01); *B29L 2031/34* (2013.01); *B29L 2031/747* (2013.01); *H01L 2933/005* (2013.01); *H01L 2933/0075* (2013.01)

(58) Field of Classification Search
USPC .......................................................... 438/27
See application file for complete search history.

(56) References Cited

U.S. PATENT DOCUMENTS 9,484,503 B2 11/2016 Hayashi et al.
2005/0212405 A1 9/2005 Negley
2005/0224829 A1 10/2005 Negley et al.
2007/0278512 A1 12/2007 Loh et al.
2008/0298063 A1 12/2008 Hayashi
2009/0050925 A1 2/2009 Kuramoto et al.
2010/0022040 A1 1/2010 Konishi et al.
2013/0170174 A1 7/2013 Chou et al.
2013/0249127 A1 9/2013 Hayashi et al.
2013/0329429 A1* 12/2013 Lowes .................. F21K 9/62
  362/247
2015/0064398 A1 3/2015 Umebayashi
2015/0233544 A1 8/2015 Kircher et al.

FOREIGN PATENT DOCUMENTS

JP  2010027974 A  2/2010
JP  2013-004939 A  1/2013
JP  2014220490 A  11/2014
JP  2016-025253 A  2/2016
KR  2016-0100349 A  8/2016

OTHER PUBLICATIONS

PCT/EP2018/074303, "International Search Report and Written Opinion," dated Nov. 14, 2018, 20 pages.

* cited by examiner

LIGHT EMITTING DEVICE AND MANUFACTURING METHOD THEREOF

CROSS-REFERENCE TO RELATED APPLICATIONS

The present application is a § 371 application of International Application No. PCT/EP2018/074303 filed on Sep. 10, 2018 and titled "LIGHT EMITTING DEVICE AND MANUFACTURING METHOD THEREOF," which claims the benefit of European Patent Application No. 17195850.7 filed on Oct. 11, 2017, and International Application No. PCT/CN2017/102216 filed on Sep. 19, 2017. International Application No. PCT/EP2018/074303, European Patent Application No. 17195850.7, and International Application No. PCT/CN2017/102216 are incorporated herein.

FIELD OF THE INVENTION

The present invention relates to the field of automotive lamps. Particularly, the present invention is directed to a light emitting device, which is suitable for use in automotive lamps, and also a method for manufacturing the same.

BACKGROUND OF THE INVENTION

In recent years, LED bulbs have been used increasingly in automotive lighting market as a replacement of the traditional halogen bulbs. LED bulbs configured with an interchangeable leadframe (LF) structure have advantages over those traditional retrofit designs in size, cost, and interchangeability. The one-piece LF design allows quick heat dissipation for LED chips and electrical components inside the bulb. Typically, in such a design, electrical components are encapsulated with transfer-molded plastics, which also serve as optical structures such as a lens. As a key process to manufacture LED bulbs with a metal LF, a conventional transfer-molding process uses transparent molding compounds so as to fulfill optical requirements. However, transparent plastics often have poor thermal conductivity, typically less than 0.1 W/(m·K), which reduces efficiency of heat dissipation. Also, as filters are added due to the optical requirements, these transparent materials often have a largely different coefficient of thermal expansion (CTE) as compared to that of metal LFs such as copper. This leads to a large stress and causes delamination or other defects to LED bulbs.

In view of above, recently, it has been proposed to use two types of materials in the transfer-molding process, which is also known as 2-component (2K for short) transfer-molding process. In 2K transfer-molding processes, one type of material is transparent for acting as optical structures, and the other is non-transparent in order to guarantee a quick heat dissipation and low CTE mismatch. The 2K transfer-molding processes perfectly overcome limitations present in conventional transfer-molding processes, and therefore, increase reliability and capacity of LED bulbs.

However, typically, in the 2K transfer-molding process, the transparent material and the non-transparent material are molded in two separate sub-processes respectively. Generally, the transparent material is transfer-molded first such that an optical lens is formed for example. After that, the non-transparent material is over-molded to enable a final encapsulation, especially of electrical components. Due to different moldings (i.e. a first transfer-molding and a second over-molding) of the two types of materials, the conventional 2K transfer-molding process involves a complex procedure and thus an increased cost. Also, conventional 2K transfer molding processes often result in a poor contact between the two kinds of materials, which subsequently may lead to gap formation, delamination and other defects of the LED bulbs.

SUMMARY OF THE INVENTION

The present invention provides a method for manufacturing a light emitting device, which is suitable for use in automotive lamps, and the light emitting device per se, so as to eliminate or at least alleviate one or more of the above mentioned drawbacks or disadvantages.

According to one aspect of the present invention, a method for manufacturing a light emitting device, which may be used in automotive lamps, is proposed. The manufacturing method comprises steps as follows: providing a base substrate with a LED die and one or more electrical components attached thereon into a first mold; melting and injecting an optical transparent material over the LED die to form an optical structure; removing the base substrate from the first mold once the optical transparent material is partially solidified; providing the base substrate into a second mold different from the first mold; and melting and injecting a thermally conductive material into the second mold while the optical transparent material is not fully solidified, for forming a thermally conductive body over the one or more electrical components, and such that an intimate connection is formed between the thermally conductive material and the optical transparent material.

In the above proposed method for manufacturing a light emitting device, two different materials, one being optical transparent and the other being thermally conductive, are molded in a process such that not only an optical structure is formed, but also the one or more electrical components of the light emitting device are well encapsulated while an intimate connection is simultaneously formed between the two materials. In the present invention, the optical transparent material is molded to form an optical structure; and meanwhile, an excellent thermal conductivity, low CTE mismatch, and potentially a strong mechanical strength are all ensured by means of the second thermally conductive material. Particularly, it should be noted that in the above described manufacturing method provided by the present invention, a special timing is chosen for melting and injecting the second thermally conductive material. That is, the thermally conductive material is melted and injected when the first optical transparent material is not yet fully solidified. In this way, an intimate and tight connection is formed between the two kinds of materials, as compared to a conventional case where the transparent material has already entirely cured when the second, thermally conductive material is brought in. In view of the above, the present invention involves improvements and advantages when compared with the conventional 2K transfer-molding, at least in this intimate and tight connection. The special timing choice and the intimate connection obtained afterwards are beneficial to the quality and lifetime of the light emitting device.

In an exemplary embodiment of the present invention, the above described method for manufacturing a light emitting device further comprises steps of: curing completely the optical transparent material and the thermally conductive material; and releasing a resulting light emitting device from the second mold. In this case, both of the optical transparent material and the thermally conductive material are cured together, so that a completely cured body comprising both materials will be obtained. This allows an enhancement in forming the intimate connection and tight contact between the optical transparent and thermally conductive materials.

In an optional embodiment of the present invention, the method for manufacturing a light emitting device as described above further comprises a cooling step, after the optical transparent material or the thermally conductive material is melted and injected. Exemplarily, with an optional cooling step after melting and injecting, a solidification of the optical transparent material or the thermally conductive material is accelerated, which may be useful for speeding up the whole manufacturing process of the light emitting device. For those skilled in the art having benefits from teaching of the present disclosure, it will be easily appreciated that the optical transparent material shall be cooled in such a way that it is not fully solidified yet when the second thermally conductive material is injected therearound.

In an exemplary embodiment of the method for manufacturing a light emitting device proposed by the present invention, the step of melting and injecting the thermally conductive material results in an encapsulation of the one or more electrical components outside the optical structure by the thermally conductive material. By means of a special melting and injecting of the thermally conductive material, electronics such as the one or more electrical components keep well encapsulated in the light emitting device. Also, because of using the thermally conductive material, not only a good thermal conductivity but also a controllable CTE mismatch are guaranteed, as compared to the conventional transparent plastics.

In an exemplary embodiment of the method for manufacturing a light emitting device proposed by the present invention, the step of melting and injecting the thermally conductive material occurs 1-10 seconds after the step of melting and injecting the optical transparent material. Under teaching of the present disclosure, those skilled in the art will conceive of other suitable values for a time interval between melting and injecting of the two materials, as long as the optical transparent material keeps partially solidified when the second thermally conductive material comes into contact with it. The present invention shall not be limited in this regard.

Preferably, in any of the above described embodiments provided by the present invention, the thermally conductive material used in the method for manufacturing a light emitting device comprises a non-transparent material. An opaque thermally conductive material may be helpful for a good encapsulation of the one or more electrical components in the light emitting device, and potentially contributes to a suppression of optical interferences caused by these electrical components and the surrounding leadframe. Further, in a specific example, the thermally conductive material and the optical transparent material are preferably made of a same base material, for example epoxy or resin.

In a further improvement, in the above described method for manufacturing a light emitting device provided by the present invention, the thermally conductive material and the optical transparent material are both in a liquid or gelatinous state when encountering each other. In case that one same material is used for both the thermally conductive material and the optical transparent material, and especially that they are even liquid or gelatinous when meeting each other, a connection having a high tightness and strength will be formed between the two.

Exemplarily, as specific options, in the above method for manufacturing a light emitting device provided by the present invention, the optical transparent material is preferably melted and injected at a temperature ranging from 140° C. to 250° C. for a time duration ranging from 10 seconds to 200 seconds. In a similar way, the thermally conductive material is preferably melted and injected at a temperature ranging from 140° C. to 250° C. for a time duration ranging from 10 seconds to 200 seconds. Further preferred, in the manufacturing for a light emitting device provided by the present invention, an injecting speed of the optical transparent material is selected to be in a range from 0.1 mm/second to 5 mm/second, and for the thermally conductive material, the injecting speed is preferably in a range from 0.1 mm/second to 5 mm/second. Therein, it should be noted that the above listed values or intervals for different melting and injecting parameters are only provided to be illustrative or exemplary but not restrictive to the present invention. Having benefits from teaching of the present disclosure, those skilled in the art will easily conceive of other different parameters suitable for melting and injecting the optical transparent material or the thermally conductive material, such as pressure, as well as their corresponding values or ranges. The present invention shall not be limited in this regard.

According to another aspect of the present invention, a light emitting device is proposed. The light emitting device comprises: a base substrate; a LED die and one or more electrical components attached on the base substrate; an optical transparent structure over the LED die; and a thermally conductive body over the one or more electrical components, wherein an intimate connection is formed between the optical transparent structure and the thermally conductive body.

As discussed previously with respect to the method for manufacturing a light emitting device, by using two different materials, not only the optical requirements are satisfied, but also an excellent thermal conductivity, a low CTE mismatch, and potentially a strong mechanical strength are all ensured. Besides, in the above proposed light emitting device, an intimate connection is also formed between the optical transparent structure and the thermally conductive body. The intimate connection can be detected from a cross sectional check of the final product, i.e., the light emitting device. This intimate connection inside the light emitting device facilitates a high product quality and lifetime, as e.g. a desirable or even perfect optical function, such as a desirable or perfect refraction of light.

In an exemplary embodiment of the above proposed light emitting device, the one or more electrical components are encapsulated outside the optical structure by the thermally conductive body. With the thermally conductive body encapsulating the electrical components, a controllable CTE mismatch, and also good heat dissipation are achieved.

Optionally, in the above described light emitting device provided by the present invention, the thermally conductive body is formed by a non-transparent material. In this case, little or even no optical interference will be caused by the one or more electrical components and the surrounding leadframe, as they all keep well encapsulated by the non-transparent thermally conductive material outside the optical structure.

Further, according to another embodiment of the present invention, the thermally conductive body and the optical transparent structure are preferably made of one same base material, such as epoxy or resin. By using a same base material for both the thermally conductive body and the optical transparent structure, the intimate connection is further enhanced between them, thus leading to an even improved product quality and lifetime.

It will be appreciated by those skilled in the art that two or more of the above disclosed embodiments, implementations and/or aspects of the present invention may be combined in any way deemed useful. Different modifications and variations to the light emitting device as well as the manufacturing method thereof can be carried out by those skilled in the art on the basis of the present disclosure.

BRIEF DESCRIPTION OF THE DRAWINGS

These and other aspects of the present invention will be described now in more detail, with reference to the appended drawings showing embodiments and forming a part of the present invention. Specifically, in the drawings.

Elements or components that are the same or similar are labeled with the same numerals in the drawings.

DETAILED DESCRIPTION OF THE EMBODIMENTS

Figure 1:
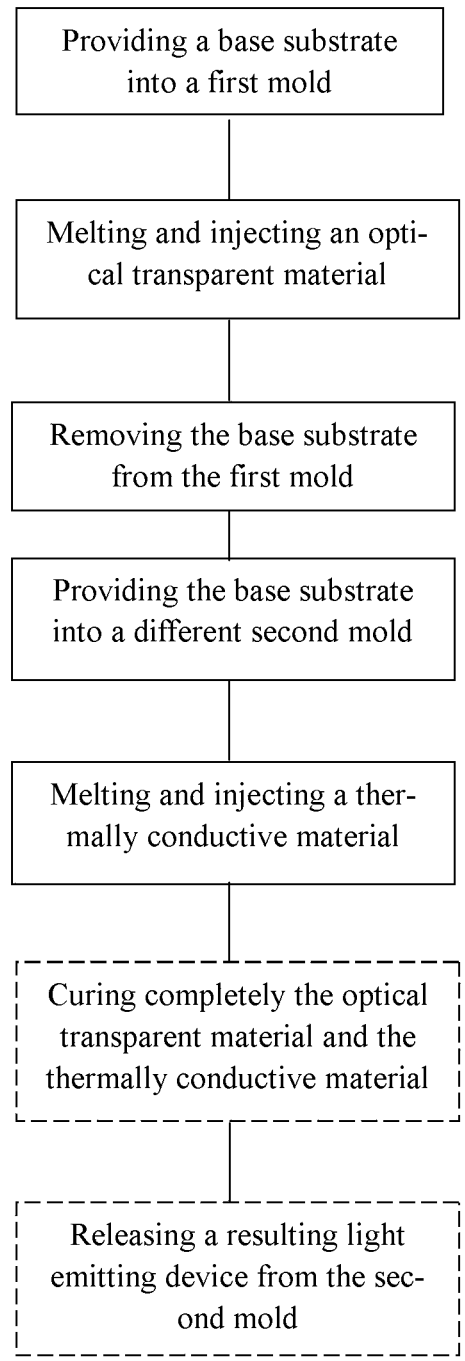
FIG. 1 schematically illustrates a flow diagram of a method for manufacturing a light emitting device according to an embodiment of the present invention.

While the present invention is susceptible of embodiments in different forms, there is shown in the drawings and will be described in detail hereinafter one or more specific embodiments with the understanding that the present description is to be considered as only exemplary of basic principles of the present invention and not intended to limit the present invention to any specific embodiments shown and described herein.

It should be noted that various components or elements shown in the figures are not drawn to scale. Besides, relative positions between various components or elements shown in the figures are only used to illustrate the basic principle of the present invention and should not be considered to limit the spirit or protection scope of the present invention.

With reference to FIGS. 1, 2a-2c all together, a method for manufacturing a light emitting device which may be used in automotive lamps as well as the light emitting device per se at different manufacturing stages are shown respectively. As can be seen, the manufacturing method specifically comprises a step of providing a base substrate (11) into a first mold, wherein the base substrate (11) has a LED die (12) and one or more electrical components (13) attached thereon, see the cross sectional view in FIG. 2a. After that, an optical transparent material is melted and injected over the LED die (12) to form an optical structure (14), see the cross sectional view in FIG. 2b. Then, the base substrate (11) is removed from the first mold once the optical transparent material gets partially solidified and inserted into a second mold different from the first mold. Finally, a thermally conductive material is melted and injected into the second mold while the optical transparent material is not fully solidified, such that an intimate connection is formed between the thermally conductive material (i.e., the corresponding thermally conductive body 15, which will be discussed later) and the optical transparent material (i.e., the corresponding optical structure 14), see the cross sectional view in FIG. 2c where the one or more electrical components (13) are covered by the thermally conductive material and thus out of sight.

Within the above proposed manufacturing method a 2K transfer-molding is used and improvements are made thereon wherein two different materials are molded in a single transfer-molding process, one material being optical transparent for acting as an optical structure and the other being thermally conductive for encapsulating electrical components. In this way, not only the optical requirements are fulfilled, but also a controllable CTE mismatch and good thermal conductivity are achieved thanks to the second thermally conductive material. Additionally, in the above described manufacturing method provided by the present invention, a special selection is also made with regard to the timing for melting and injecting the thermally conductive material. Specifically, the thermally conductive material is melted and injected when the first optical transparent material is not yet fully solidified, i.e., is only partially solidified. Thus, an intimate and tight connection or, in other words, contact is formed between the two kinds of materials since they are meeting each other while not in a solid state. This is advantageous for achieving superior product quality and lifetime.

Optionally, as shown by dashed boxes in FIG. 1, the above described method for manufacturing a light emitting device further comprises the following steps of: curing completely the optical transparent material and the thermally conductive material; and releasing a resulting light emitting device from the second mold. In this way, the two materials are cured together while in a liquid or gelatinous state, which allows an enhancement in forming the intimate and tight connection between them. Additionally, in another embodiment of the above described method, the step of melting and injecting the thermally conductive material results in an encapsulation of the one or more electrical components (13) outside the optical structure (14) by the thermally conductive material. The encapsulation of the electrical components (13) will become obvious from a comparison between the cross sectional views in FIG. 2b and FIG. 2c, where the one or more electrical components (13) are invisible in FIG. 2c due to the fact that they are all covered by the thermally conductive body (15). This helps to keep the electrical components (13) well encapsulated in the light emitting device.

Preferably, in any of the above described embodiments of the manufacturing method, the thermally conductive material is non-transparent. An opaque thermally conductive material helps to achieve a good encapsulation of the one or more electrical components (13), which are entirely covered by the thermally conductive body (15) in FIG. 2c and thus invisible there, and potentially suppress their optical interferences.

Figure 2A:
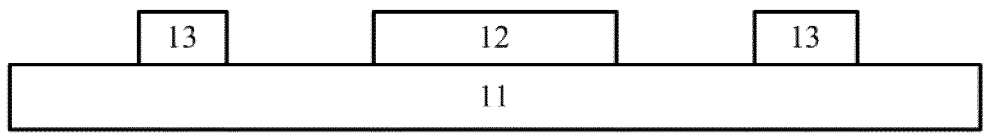
FIGS. 2a-2c schematically illustrate a cross sectional view of a light emitting device at different manufacturing stages according to an embodiment of the present invention.
Figure 2B:
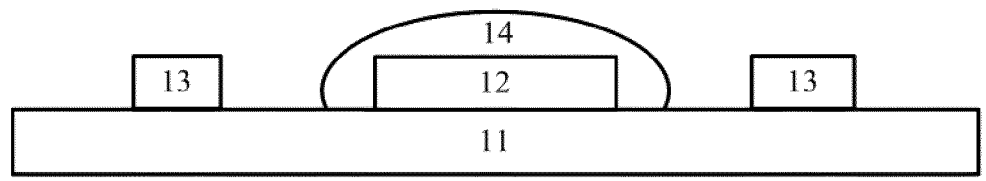
Figure 2C:
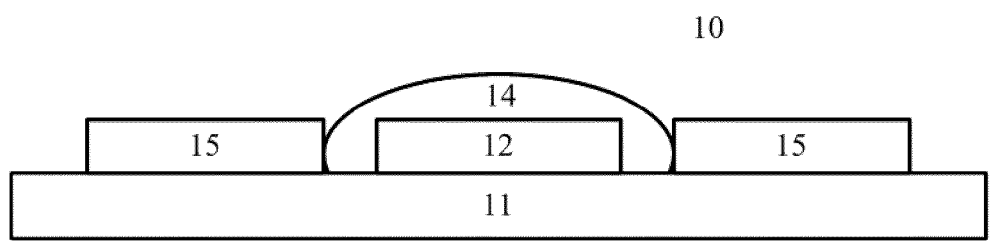

As discussed above, a light emitting device (10) is also proposed per se. With reference to FIG. 2c, the light emitting device (10) comprises: a base substrate (11); a LED die (12) and one or more electrical components (invisible in FIG. 2c and indicated by the reference numeral of 13 in FIGS. 2a-2b) attached on the base substrate (11); an optical transparent structure (14) over the LED die (12); and a thermally conductive body (15) over the one or more electrical components (invisible in FIG. 2c and indicated by the reference numeral of 13 in FIGS. 2a-2b). Further, in the above mentioned light emitting device (10), an intimate connection is formed between the optical transparent structure (14) and the thermally conductive body (15).

Similarly, with two different materials, one for optical structure (14) and one for thermally conductive body (15), used in the light emitting device (10), not only the optical requirements are satisfied, but also an excellent thermal conductivity, a low CTE mismatch, and potentially a strong mechanical strength are all ensured. Besides, in the above proposed light emitting device (10), an intimate connection is also formed between the optical transparent structure (14) and the thermally conductive body (15). The intimate connection can be detected from a cross sectional check of the final light emitting device (15), such as by an optical microscope inspection. This intimate connection or, in other words, tight merging part, of the two materials improves product quality and lifetime.

To sum up, the method for manufacturing a light emitting device as proposed in the present invention achieves two-material molding in a single one process, wherein one of the materials is designed for optical considerations and the other is for thermal effects. In a resulting light emitting device, an intimate and tight connection is formed at an interface or merging part of the two kinds of materials. In this way, the two materials, and thus the final product, are enabled to be durable, cost-efficient, and tightly bonded, which is advantageous for an excellent optical performance and enhanced lifetime.

It should be noted that the present invention is suitable for all LED applications using leadframe and transfer-molding, and not limited only to the specific embodiments and examples as listed above. Also, although the optical structure is shown in the figures of the present disclosure to have only a dome shape, the present invention should not be limited in this regard, and any other different shapes, such as a hemispherical shape, can be used for the optical structure as appropriate.

Further, it should be noticed that the above-mentioned embodiments illustrate rather than limit the present invention, and that those skilled in the art will be able to design many alternative embodiments without departing from the scope and spirit of the present invention. Although the present invention has been described in connection with some embodiments, it is not intended to be limited to the specific forms as set forth herein. Rather, the scope of the present invention is defined only by the accompanying claims. Additionally, although features may appear to be described in connection with particular embodiments, those skilled in the art would recognize that various features of the described embodiments may be combined in accordance with the invention.

Furthermore, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather indicates that the feature is equally applicable to other claim categories as appropriate.

In the claims, any reference signs placed between parentheses should not be construed as limiting the claims. Use of the verb "comprise" and its conjugations does not exclude the presence of elements or steps other than those stated in a claim. The article "a" or "an" preceding an element does not exclude the presence of a plurality of such elements. Further, references to first, second etc. are merely to be considered as labels and do not imply or describe any ordering, sequence, relation or properties of the features prefixed by these terms. The mere fact that certain measures are recited in mutually different dependent claims does not indicate that a combination of these measures cannot be used to advantage.

LIST OF REFERENCE NUMERALS

10—Light Emitting Device
11—Base Substrate
12—LED Die
13—One or More Electrical Components
14—Optical Structure
15—Thermally Conductive Body

The invention claimed is:

1. A method for manufacturing a light emitting device, comprising steps of:
   providing a base substrate with a LED die and one or more electrical components attached thereon into a first mold,
   melting and injecting an optical transparent material over the LED die to form an optical structure,
   removing the base substrate from the first mold once the optical transparent material is partially solidified,
   providing the base substrate into a second mold different from the first mold, and
   melting and injecting a thermally conductive material into the second mold while the optical transparent material is not fully solidified, for forming a thermally conductive body over the one or more electrical components, and such that an intimate connection is formed between the thermally conductive material and the optical transparent material.

2. The method for manufacturing the light emitting device in accordance with claim 1, further comprising:
   curing completely the optical transparent material and the thermally conductive material.

3. The method for manufacturing the light emitting device in accordance with claim 1, further comprising:
   a step of cooling, after melting and injecting the optical transparent material or the thermally conductive material.

4. The method for manufacturing the light emitting device in accordance with claim 1, wherein
   the step of melting and injecting the thermally conductive material results in an encapsulation of the one or more electrical components outside the optical structure by the thermally conductive material.

5. The method for manufacturing the light emitting device in accordance with claim 1, wherein
   the step of melting and injecting the thermally conductive material occurs 1-10 seconds after the step of melting and injecting the optical transparent material.

6. The method for manufacturing the light emitting device in accordance with claim 1, wherein
   the thermally conductive material comprises a non-transparent material.

7. The method for manufacturing the light emitting device in accordance with claim 1, wherein
   the thermally conductive material and the optical transparent material are made of a same base material.

8. The method for manufacturing the light emitting device in accordance with claim 1, wherein
   the thermally conductive material and the optical transparent material are both in a liquid or gelatinous state when encountering each other.

9. The method for manufacturing the light emitting device in accordance with claim 1, wherein
   the optical transparent material is melted and injected at a temperature ranging from 140° C. to 250° C. for a time duration ranging from 10 seconds to 200 seconds.

10. The method for manufacturing the light emitting device in accordance with claim 1, wherein
    an injecting speed of the optical transparent material ranges from 0.1 mm/second to 5 mm/second.

11. The method for manufacturing the light emitting device in accordance with claim 2, further comprising:

releasing a resulting light emitting device from the second mold.

12. The method for manufacturing the light emitting device in accordance with claim 1, wherein
the thermally conductive material is melted and injected at a temperature ranging from 140° C. to 250° C. for a time duration ranging from 10 seconds to 200 seconds.

13. The method for manufacturing the light emitting device in accordance with claim 1, wherein
an injecting speed of the thermally conductive material ranges from 0.1 mm/second to 5 mm/second.

14. The method for manufacturing the light emitting device in accordance with claim 1, wherein
the thermally conductive material is epoxy or resin.

15. The method for manufacturing the light emitting device in accordance with claim 1, wherein
the optical transparent material is epoxy or resin.

16. The method for manufacturing the light emitting device in accordance with claim 1, wherein
the thermally conductive material and the optical transparent material are both in a liquid or gelatinous state when encountering each other, and are made of a same base material.

* * * * *